(12) United States Patent
Mobley et al.

(10) Patent No.: US 9,184,064 B1
(45) Date of Patent: Nov. 10, 2015

(54) SYSTEM AND METHOD FOR METALLIZATION AND REINFORCEMENT OF GLASS SUBSTRATES

(71) Applicant: Triton Microtechnologies, Oro Valley, AZ (US)

(72) Inventors: Tim Mobley, Marana, AZ (US); Roupen Leon Keusseyan, Carlsbad, CA (US); Charles Tucker, Los Olivos, CA (US)

(73) Assignee: TRITON MICROTECHNOLOGIES, Oro Valley, AZ (US)

( * ) Notice: Subject to any disclaimer, the term of this patent is extended or adjusted under 35 U.S.C. 154(b) by 0 days.

(21) Appl. No.: 14/568,977

(22) Filed: Dec. 12, 2014

Related U.S. Application Data

(63) Continuation-in-part of application No. 13/666,089, filed on Nov. 1, 2012.

(60) Provisional application No. 61/985,697, filed on Apr. 29, 2014, provisional application No. 61/947,577, filed on Mar. 4, 2014, provisional application No. 61/554,417, filed on Nov. 1, 2011.

(51) Int. Cl.

| | | |
|---|---|---|
| H01L 21/48 | (2006.01) |
| C23C 18/16 | (2006.01) |
| C23C 18/32 | (2006.01) |
| C23C 28/02 | (2006.01) |
| C23C 2/04 | (2006.01) |
| H01L 23/538 | (2006.01) |
| H01L 23/15 | (2006.01) |

(52) U.S. Cl.
CPC ............... *H01L 21/486* (2013.01); *C23C 2/04* (2013.01); *C23C 18/165* (2013.01); *C23C 18/32* (2013.01); *C23C 28/023* (2013.01); *H01L 21/4853* (2013.01); *H01L 21/4857* (2013.01); *H01L 21/4867* (2013.01); *H01L 23/15* (2013.01); *H01L 23/5384* (2013.01)

(58) Field of Classification Search
CPC ...... H05K 3/42–3/429; H05K 3/4038–3/4084; H05K 3/4007–3/4015; H05K 1/0306; H01L 21/486; H01L 23/5384; H01L 23/15; H01L 2224/0401; H01L 2224/81005; H01L 2224/11001; H01L 2224/11009
See application file for complete search history.

(56) References Cited

U.S. PATENT DOCUMENTS

| | | | |
|---|---|---|---|
| 5,283,104 A * | 2/1994 | Aoude et al. ............... 428/195.1 |
| 7,183,650 B2 | 2/2007 | Shiono |
| 8,411,459 B2 | 4/2013 | Yu |
| 8,584,354 B2 | 11/2013 | Cornejo |
| 2004/0217455 A1 * | 11/2004 | Shiono et al. ................. 257/678 |
| 2011/0108931 A1 | 5/2011 | Mohri |
| 2011/0220925 A1 | 9/2011 | Greenwood |
| 2012/0106117 A1 | 5/2012 | Sundaram et al. |
| 2013/0119555 A1 | 5/2013 | Sundaram et al. |
| 2013/0242493 A1 | 9/2013 | Shenoy et al. |
| 2013/0341653 A1 | 12/2013 | Yuan |

\* cited by examiner

*Primary Examiner* — Jose R Diaz

(57) ABSTRACT

A method for backside metallization and reinforcement of glass substrates to provide support and protection during handling and processing of the glass substrates. Through-holes are created in a glass substrate and filled with a conductive type material. Backside metallized pads are applied to the glass substrate and enclosed with an under-bump metallization (UBM) pad. A sacrificial substrate is removeably attached to the glass substrate. The sacrificial substrate comprises a sacrificial layer, an opaque film, and an adhesive. The sacrificial substrate protects the backside metallized pads and under-bump metallization (UBM) pads, and reinforces the glass substrate.

20 Claims, 6 Drawing Sheets

SYSTEM AND METHOD FOR METALLIZATION AND REINFORCEMENT OF GLASS SUBSTRATES

CROSS REFERENCE

This application claims priority to U.S. Provisional Patent Application No. 61/947,577, filed Mar. 4, 2014, and U.S. Provisional Patent Application No. 61/985,697, filed Apr. 29, 2014, the specification(s) of which is/are incorporated herein in their entirety by reference.

This application claims priority to U.S. patent application Ser. No. 13/666,089, filed Nov. 1, 2012, which is a non-provisional of U.S. Provisional Patent Application No. 61/554,417, filed Nov. 1, 2011, the specification(s) of which is/are incorporated herein in their entirety by reference.

FIELD OF THE INVENTION

The present invention relates to a method for glass substrate metallization and reinforcement to provide protection and support during handling and processing of glass substrates.

BACKGROUND OF THE INVENTION

Semiconductor devices are constantly responding to the market demand for faster, smaller, higher data and less expensive devices. Devices are expected to deliver more functionality at greater speeds in smaller dimensions and with capabilities of electrical and optical signals. This requires a new packaging scheme that can integrate heterogeneous devices such as logic, memory, power, graphics, sensors and other integrated circuits and components in a single package where improved electrical performance is also achieved by having these devices in close proximity.

An example of such packaging scheme is thin glass interposers or through-glass via (TGV) wafers. Thin glass interposers have microscopic through-holes filled with materials that are usually metallized, and can act as connectors between the top and bottom surface of the glass substrate to transfer electronic signals and currents to semiconductor or other devices. These interposers are also very thin, having thicknesses in the micrometer range. The thinness of the thin glass interposers can make them difficult to handle and process, especially when users lack the proper mechanisms to do so.

Applying circuit metallization to one or both side of thin glass interposers is a challenging process. Typically, a sacrificial wafer is attached to a first surface of the thin glass interposer, then the opposing surface is metallized and patterned. Next, the sacrificial wafer is removed and the first surface is processed by metallization, patterning, assembly, etc. This process prolongs the manufacturing time, thereby increasing production costs.

The present invention resolves the above-stated issues by providing a simple, low cost, and potentially reusable method that will allow users to work on the thin glass interposers and similar glass substrates without damaging them. A sacrificial wafer is attached to a first surface that is already metallized, which allows for the opposing surface to be processed while the sacrificial wafer protects the metallized first surface and reinforces the thin glass interposer.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a method of glass substrate metallization and reinforcement for protecting metallization on a glass substrate surface and supporting the glass substrate during processing. In some embodiments, the method comprises creating a plurality of through-holes in the glass substrate, filling the through-holes with a conductive type material, applying a plurality of backside metallized pads to the glass substrate, enclosing the backside metallized pads with an under-bump metallization (UBM) pad, and attaching a sacrificial substrate to the glass substrate.

The present invention features a glass substrate metallization and reinforcing system for protecting metallization on a glass substrate surface and supporting the glass substrate during processing. In some embodiments, the system comprises a sacrificial substrate and a glass substrate comprising a plurality of through-holes, a plurality of backside metallized pads, and a plurality of under-bump metallization (UBM) pads enclosing the backside metallized pads.

In some embodiments, the sacrificial substrate comprises a sacrificial layer, an opaque film, and an adhesive. In some embodiments, the adhesive binds the sacrificial layer to the glass substrate. In some embodiments, the sacrificial substrate protects the backside metallized pads and UBM pads. In some embodiments, the sacrificial substrate reinforces the glass substrate to provide support during handling and processing of the glass substrate.

DESCRIPTION OF PREFERRED EMBODIMENTS

Figure 1:
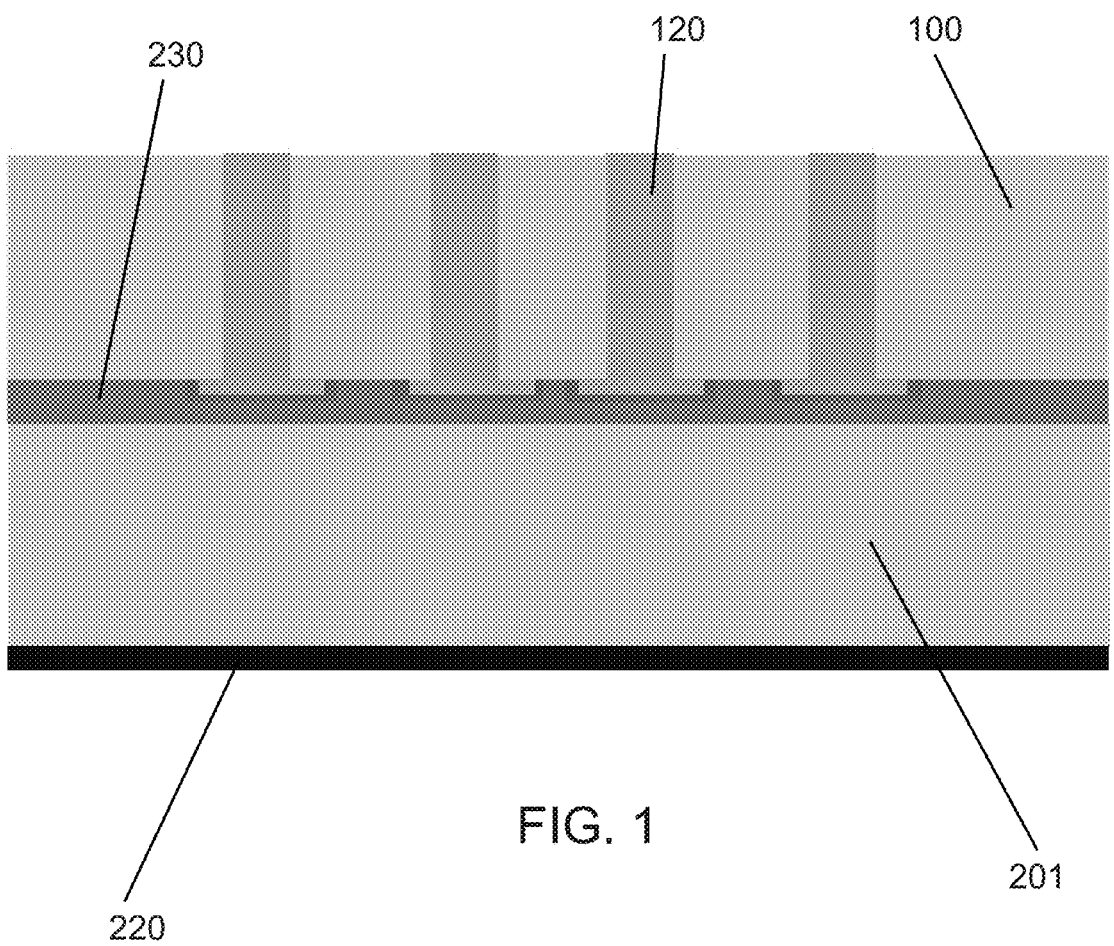
FIG. 1 shows a cross-sectional view of an exemplary embodiment of the present invention.
Figure 2:
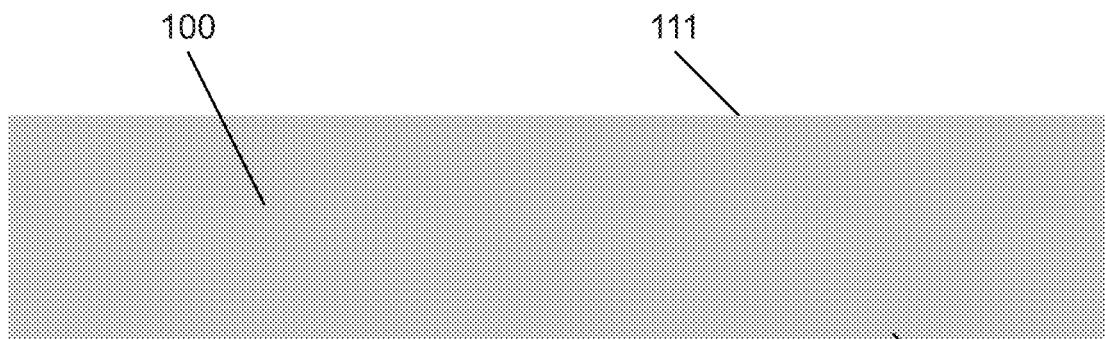
FIG. 2 shows a glass substrate of the present invention.
Figure 3:
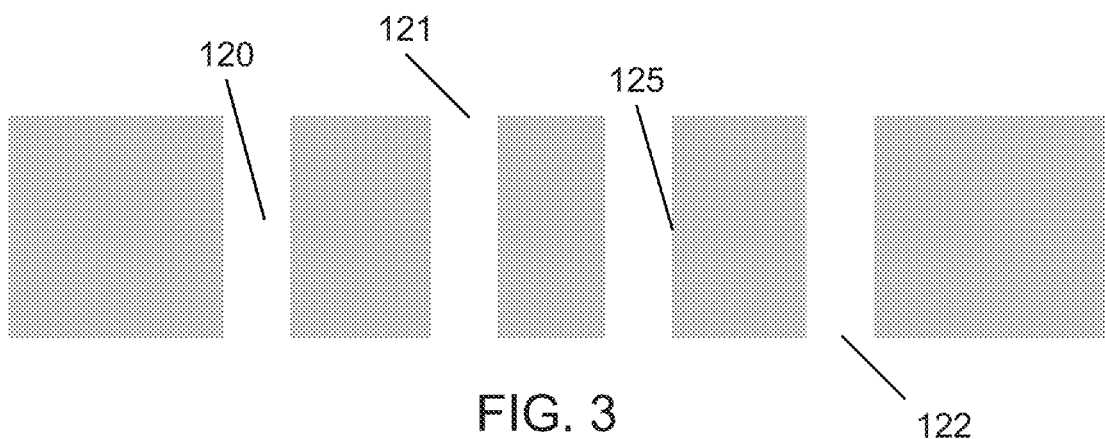
FIG. 3 shows a glass substrate with through-holes of the present invention.
Figure 4:
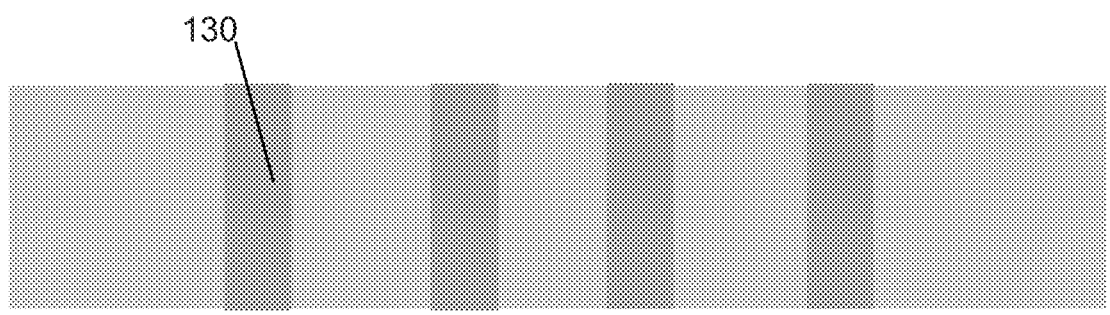
FIG. 4 shows a glass substrate with filled through-holes of the present invention.
Figure 5:
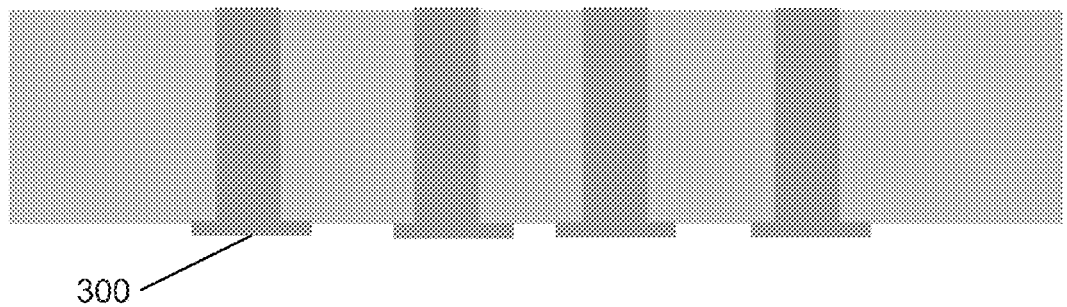
FIG. 5 shows a glass substrate with filled through-holes and backside metallized pads of the present invention.
Figure 6:
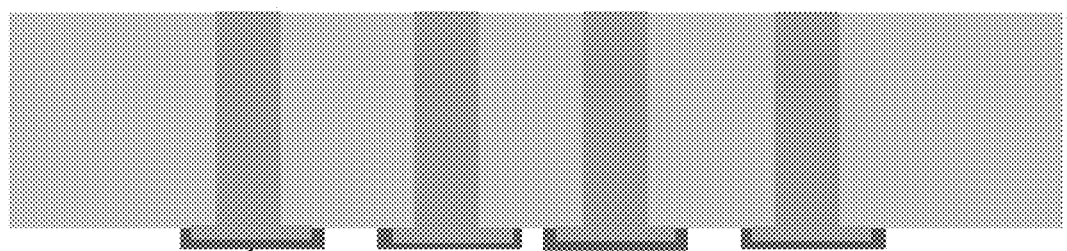
FIG. 6 shows a glass substrate with filled through-holes, backside metallized pads, and plating for under-bump metallization (UBM) pads of the present invention.

Following is a list of elements corresponding to a particular element referred to herein:
100 a glass substrate
111 a top surface of the glass substrate
112 a bottom surface of the glass substrate 120 a through-hole, or collectively, a plurality of through-holes formed through the glass substrate 100
121 a top end of the through-hole
122 a bottom end of the through-hole
125 a sidewall of the through-hole
130 an interior layer filled, for example, with a conductor composition
200 a sacrificial substrate
201 a sacrificial layer
211 a top surface of the sacrificial layer
212 a bottom surface of the sacrificial layer
220 an opaque film
230 an adhesive for attaching the glass substrate (100) to the sacrificial substrate (200)
300 a backside metallized pad, or collectively, a plurality of backside metallized pads
400 a under-bump metallization (UBM) pad, or collectively, a plurality of UBM pads
500 a bump, or collectively, a plurality of bumps As used herein, the word "hole" and "through-hole" are used interchangeably. As used herein, the term "substantially" is defined as being largely that which is specified. As used herein, the term "partially" is defined as being to some extent, but no wholly, that which is specified. As used herein, the term "completely" is defined as being wholly or entirely that which is specified.

Method

Referring now to FIGS. 1-12, the present invention features a method of back metallizing and reinforcing a glass substrate (100) for protecting the metallization and supporting the glass substrate (100) during processing. In some embodiments, the method comprises creating a plurality of through-holes (120) in the glass substrate (100); filling the through-holes (120) with a conductive type material; applying a plurality of backside metallized pads (300) to a bottom surface (112) of the glass substrate (100), enclosing the backside metallized pads (300) with an under-bump metallization (UBM) pad (400); and attaching a sacrificial substrate (200) to the glass substrate (100).

In some embodiments, the sacrificial substrate (200) comprises a sacrificial layer (201) comprising a top surface (211) and a bottom surface (212). In some embodiments, an opaque film (220) coats the top surface (211), the bottom surface (212), or both the top surface (211) and the bottom surface (212) of the sacrificial layer (201). In some embodiments, the sacrificial substrate (200) further comprises an adhesive (230) applied to the top surface (211) of the sacrificial layer (201). In some embodiments, the adhesive (230) binds the sacrificial layer (201) to the bottom surface (112) of the glass substrate (100). In some embodiments, the sacrificial substrate (200) protects the backside metallized pads (300) and the UBM pads (400). In some embodiments, the sacrificial substrate (200) reinforces the glass substrate (100) to provide support during handling and processing of the glass substrate (100).

In some embodiments, a plurality of bumps (500) is attached to the UBM pads (400). In some embodiments, a plurality of redistribution layers is applied to the bottom surface (112) of the glass substrate (100) prior to applying the backside metallized pads (300). In some embodiments, the redistribution layer is plated for improved performance and functionality. In some embodiments, the redistribution layer is spin-coated, sprayed, screened, or laminated onto the surface. In some embodiments, the redistribution layer is applied using thick film technology or thin film technology.

In some embodiments, the present invention features a method of back metallizing and reinforcing a glass substrate (100). In some embodiments, the method comprises creating a plurality of through-holes (120) in the glass substrate (100); filling the through-holes (120) with a conductive type material; applying a plurality of backside metallized pads (300) to a bottom surface (112) of the glass substrate (100); enclosing the backside metallized pads (300) with an under-bump metallization (UBM) pad (400); attaching a plurality of bumps (500) to the UBM pads (400); and attaching a sacrificial substrate (200) to the glass substrate (100). In some embodiments, the holes are created by etching the glass substrate. In some embodiments, the holes are created by a laser. In some embodiments, the sacrificial substrate (200) comprises a sacrificial layer (201) comprising a top surface (211) and a bottom surface (212). In some embodiments, an opaque film (220) coats the top surface (211), the bottom surface (212), or both the top surface (211) and the bottom surface (212) of the sacrificial layer (201). In some embodiments, an adhesive (230) is applied to the top surface (211) of the sacrificial layer (201). In some embodiments, the adhesive (230) binds the sacrificial layer (201) to the bottom surface (112) of the glass substrate (100).

In some embodiments, applying the backside metallized pads (300) comprises screen printing the backside metallized pads (300) onto the glass substrate (100); drying the backside metallized pads (300); and sintering the backside metallized pads (300).

In some embodiments, the method further comprises applying at least one layer of plating on the UBM pads (400). In some embodiments, at least two layers of plating is applied on the UBM pads (400). In some embodiments, at least three layers of plating is applied on the UBM pads (400). In some embodiments, plating is applied to the UBM pads (400) prior to attaching the sacrificial substrate (200) or plurality of bumps (500) to the UBM pads (400). In some embodiments, a first layer of plating disposed on the UBM pads comprises Ti, Ni, or Al. In some embodiments, a second layer of plating comprises Cu or Au. In some embodiments, a third layer of plating comprises electroless and immersion metals. In some embodiments, the electroless and immersion metals is electroless nickel immersion gold (ENIG) or electroless nickel/immersion palladium/immersion gold (ENIPIG).

In some embodiments, the opaque film (220) is screen printed, laminated, sprayed, or thin-film deposited onto the sacrificial layer (201). In some embodiments, the opaque (220) film is dried and sintered. In some embodiments, the glass substrate (100) and the sacrificial layer (201) are identical in shape and size.

In some embodiments, a top surface (111) of the glass substrate (100) is coated with at least one redistribution layer. In some embodiments, at least one electronic component is attached to the top surface (111) of the glass substrate (100). In some embodiments, the top surface (111) of the glass substrate (100) is metallized. In some embodiments, the top surface (111) of the glass substrate (100) is polished. In some embodiments, the top surface (111) of the glass substrate (100) is wire bonded. Examples of electronic components may include, but are not limited to, capacitors, resistors, transistors, chips, and the like.

The following are non-limiting examples of attaching the electronic components to the glass substrate:

The electronic component is normally attached to the glass substrate by:
1. Die attach by brazing (Au, Sn, Ge, Si, etc. based), silver glass, soldering (low or high temperature, epoxy (filled or unfilled) or similar organic material that is cured.
2. Wire-bond pads on the integrated circuit (IC) onto other pads on the glass substrate.

3. Flip chip or similar approach to attach the chip onto pads on the glass substrate, using solders or brazing materials that are alloys of one of these metals: Au, Al, Sn, Ge, Si, Ag, Pb, Cu, Bi, In, Zn, or similar metals and alloys commonly used in the industry.

In some embodiments, the sacrificial substrate (200) is disengaged, or de-bonded, from the glass substrate (100). In some embodiments, the de-bonding temperature is in a range between room temperature and 275° C. In some embodiments, the sacrificial substrate (200) is disengaged, or de-bonded, from the glass substrate (100) by thermal slide, solvent wash, YAG laser, excimer laser, mechanical means, UV curing, peeling adhesive, or UV irradiation. In some embodiments, the glass substrate (100) is cleaned after disengaging from the sacrificial substrate (200). In some embodiments, the glass substrate is cleaned (100) by rinsing with deionized water, dissolution or dry etching. In some embodiments, the sacrificial substrate (200) is reusable.

In some embodiments, the backside metallized pads (300) cover the bottom end (122) of the through-holes (120). In some embodiments, the backside metallized pads (300) are patterned. In some embodiments, the backside metallized pads (300) completely cover the bottom surface (112) of the glass substrate (100). In some embodiments, the backside metallized pads (300) partially cover the bottom surface (112) of the glass substrate (100). In some embodiments, the backside metallized pads (300) comprises copper, silver, gold or other conductive metals or metal compounds. In some embodiments, the UBM pads (400) comprises copper, silver, gold or other conductive metals or metal compounds. In some embodiments, the electronic component is a chip or integrated circuit.

In some embodiments, the conductive type material comprises a metal; a glass frit composition; a solvent; a resin; and a non-conductive inert additive. In some embodiments, the metal comprises a pure metal. In some embodiments, the metal comprises a metal compound. In some embodiments, the metal is coated onto a particulate. In some embodiments, the metal comprises copper, silver, gold, nickel, tungsten, molybdenum, silicon, aluminum, zinc, barium, boron, bismuth, titanium, or a combination thereof. In some embodiments, the metal comprises a conductive powder, wherein the conductive powder comprises a core, wherein the core is coated with copper, silver, gold, nickel, tungsten, molybdenum, silicon, aluminum, zinc, barium, boron, bismuth, titanium, or a combination thereof.

In some embodiments, the metal particle size ranges from 0.04 to 24 microns for D50 (fifty percentile particle size distribution). In some embodiments, the metal is combined with oxides and compounds of the metal and mixtures thereof.

In some embodiments, the glass frit composition comprises a mixture of glass frits. In some embodiments, the glass frit composition comprises the oxide and compounds of the following materials: Ag, Al, B, Bi, Ce, Cu, Co, F, Pb, Al, Zn, Zr, Si, Ba, Ru, Sn, Te, Ti, V, Na, K, Li, Ca, and P. In some embodiments, the glass frit composition particle size ranges from 0.04 to 24 microns for D50 (fifty percentile particle size distribution).

In some embodiments, the solvent comprises Terpineol, Texanol, Dowanol, butyl carbitol, butyl carbitol acetate, methyl-ethyl-butyl ethers, or other solvents used in the thick film and conductive polymer industries or a combination thereof. In some embodiments, the resin comprises ethyl cellulose based compositions and mixtures or other resin systems typically used in the thick film industry. In some embodiments, the resin comprises resin systems similar to ethyl cellulose based compositions and mixtures. In some embodiments, the resin is natural, synthetic or a combination thereof. In some embodiments, the inert additive comprises tungsten, molybdenum, aluminum, zinc, zirconium, silicon, lanthanum, ruthenium, cobalt, nickel, their compounds and oxides, or a combination thereof.

System

The present invention features a backside metallizing and reinforcing system for a glass substrate (100). In some embodiments, the system comprises the glass substrate (100) comprising a plurality of through-holes (120) extending from a top surface (111) to the bottom surface (112) of the glass substrate (100); a plurality of backside metallized pads (300), wherein the backside metallized pads (300) is disposed on the bottom surface (112) of the glass substrate (100); a plurality of under-bump metallization (UBM) pads (400) enclosing the backside metallized pads (300); and a sacrificial substrate (200).

In some embodiments, the sacrificial substrate (200) comprises a sacrificial layer (201) comprising a top surface (211) and a bottom surface (212). In some embodiments, an opaque film (220) coats the top surface (211), the bottom surface (212), or both the top surface (211) and the bottom surface (212) of the sacrificial layer (201). In some embodiments, an adhesive (230) is applied to the top surface (211) of the sacrificial layer (201). In some embodiments, the adhesive (230) binds the sacrificial layer (201) to the bottom surface (112) of the glass substrate (100). In some embodiments, the sacrificial substrate (200) protects the backside metallized pads (300) and the UBM pads (400). In some embodiments, the sacrificial substrate (200) reinforces the glass substrate (100) to provide support during handling and processing of the glass substrate (100).

In some embodiments, a plurality of bumps (500) is attached to the UBM pads (400). In some embodiments, a plurality of redistribution layers is applied to the bottom surface (112) of the glass substrate (100) prior to applying the backside metallized pads (300).

In some embodiments, each of the holes (120) comprises a top end (121), a bottom end (122), a sidewall (125), and at least one interior layer (130) disposed inside the hole (120). In some embodiments, the interior layer (130) comprises at least one metallized layer. In some embodiments, the metallized layer comprises at least one conductive type material. In some embodiments, the hole (120) is substantially filled with at least one conductive type material. In some embodiments, at least one metallized layer substantially occupies the volume of the hole (120) after firing and curing the glass substrate (100). In some embodiments, the hole (120) is hermetic. In some embodiments, the hole (120) has a low resistivity.

As defined by the Department of Defense's test method standards for seals, hermeticity is the effectiveness of the seal of microelectronic and semi-conductor devices with designed internal cavities. The failure criteria for hermeticity vary depending on the application and are defined by the Department of Defense's test method standards for seals.

In some embodiments, the filled hole (120) has a high conductivity. In some embodiments, the filled hole (120) has a low resistivity. In some embodiments, the resistivity is less than 25 milli-ohm/square. In some embodiments, the resistivity is less than 20 milli-ohm/square. In some embodiments, the resistivity is less than 15 milli-ohm/square. In some embodiments, the resistivity is less than 10 milli-ohm/square. In some embodiments, the resistivity is less than 5 milli-ohm/square. In some embodiments, the resistivity is less than 3 milli-ohm/square. In some embodiments, the resistivity is less than 2 milli-ohm/square. In some embodiments, the resistivity is less than 1 milli-ohm/square.

In some embodiments, applying the backside metallized pads (300) comprises screen printing the backside metallized pads (300) onto the glass substrate (100); drying the backside metallized pads (300); and sintering the backside metallized pads (300).

In some embodiments, the opaque film (220) is screen printed onto the sacrificial layer (201). In some embodiments, the opaque (220) film is dried and sintered. In some embodiments, the glass substrate (100) and the sacrificial layer (201) are identical in shape and size.

In some embodiments, a top surface (111) of the glass substrate (100) is coated with at least one redistribution layer. In some embodiments, at least one electronic component is attached to the top surface (111) of the glass substrate (100). In some embodiments, the top surface (111) of the glass substrate (100) is metallized. In some embodiments, the top surface (111) of the glass substrate (100) is polished. In some embodiments, the top surface (111) of the glass substrate (100) is wire bonded.

In some embodiments, at least one layer of plating is disposed on the UBM pads (400). In some embodiments, at least two layers of plating is disposed on the UBM pads (400). In some embodiments, at least three layers of plating is disposed on the UBM pads (400). In some embodiments, a first layer of plating disposed on the UBM pads comprises Ti, Ni, or Al. In some embodiments, a second layer of plating comprises Cu or Au. In some embodiments, a third layer of plating comprises electroless and immersion metals. In some embodiments, the electroless and immersion metals is electroless nickel immersion gold (ENIG) or electroless nickel/immersion palladium/immersion gold (ENIPIG).

In some embodiments, the sacrificial substrate (200) is disengaged, or de-bonded, from the glass substrate (100). In some embodiments, the de-bonding temperature is in a range between room temperature and 275° C. In some embodiments, the sacrificial substrate (200) is disengaged, or de-bonded, from the glass substrate (100) by thermal slide, solvent wash, YAG laser, excimer laser, mechanical means, UV curing, peeling adhesive, or UV irradiation. In some embodiments, the glass substrate (100) is cleaned after disengaging from the sacrificial substrate (200). In some embodiments, the glass substrate is cleaned (100) by rinsing with deionized water, dissolution or dry etching. In some embodiments, the sacrificial substrate (200) is reusable.

In some embodiments, the backside metallized pads (300) cover the bottom end (122) of the through-holes (120). In some embodiments, the backside metallized pads (300) are patterned. In some embodiments, the backside metallized pads (300) completely cover the bottom surface (112) of the glass substrate (100). In some embodiments, the backside metallized pads (300) partially cover the bottom surface (112) of the glass substrate (100). In some embodiments, the backside metallized pads (300) comprises copper, silver, gold or other conductive metals or metal compounds. In some embodiments, the UBM pads (400) comprises copper, silver, gold or other conductive metals or metal compounds. In some embodiments, the electronic component is a chip or integrated circuit.

In some embodiments, the conductive type material comprises at least one metal; at least one glass frit composition; at least one solvent; at least one resin; and at least one non-conductive inert additive. In some embodiments, the metal comprises a pure metal. In some embodiments, the metal comprises a metal compound. In some embodiments, the metal is coated onto a particulate. In some embodiments, the metal comprises copper, silver, gold, nickel, tungsten, molybdenum, silicon, aluminum, zinc, barium, boron, bismuth, titanium, or a combination thereof. In some embodiments, the metal comprises a conductive powder, wherein the conductive powder comprises a core, wherein the core is coated with copper, silver, gold, nickel, tungsten, molybdenum, silicon, aluminum, zinc, barium, boron, bismuth, titanium, or a combination thereof.

In some embodiments, the metal particle size ranges from 0.04 to 24 microns for D50 (fifty percentile particle size distribution). In some embodiments, the metal is combined with oxides and compounds of the metal and mixtures thereof.

In some embodiments, the glass frit composition comprises a mixture of glass frits. In some embodiments, the glass frit composition comprises the oxide and compounds of the following materials: Ag, Al, B, Bi, Ce, Cu, Co, F, Pb, Al, Zn, Zr, Si, Ba, Ru, Sn, Te, Ti, V, Na, K, Li, Ca, and P. In some embodiments, the glass frit composition particle size ranges from 0.04 to 24 microns for D50 (fifty percentile particle size distribution).

In some embodiments, the solvent comprises Terpineol, Texanol, Dowanol, butyl carbitol, butyl carbitol acetate, methyl-ethyl-butyl ethers, or other solvents used in the thick film and conductive polymer industries or a combination thereof. In some embodiments, the resin comprises ethyl cellulose based compositions and mixtures. In some embodiments, the resin comprises resin systems similar to ethyl cellulose based compositions and mixtures. In some embodiments, the resin is natural, synthetic or a combination thereof. In some embodiments, the inert additive comprises tungsten, molybdenum, aluminum, zinc, zirconium, silicon, lanthanum, ruthenium, cobalt, nickel, their compounds and oxides, or a combination thereof.

Without wishing to limit the present invention to a particular theory or mechanism or function, the filled through-holes (120) provide an electrical connection without the use of any electrical leads such as wire bonds or epoxy. In some embodiments, the interior layer (130) touches the backside metallized pads (300). In some embodiments, the interior layer (130) terminates at the top surface (111) of the glass substrate (100).

Figure 7:
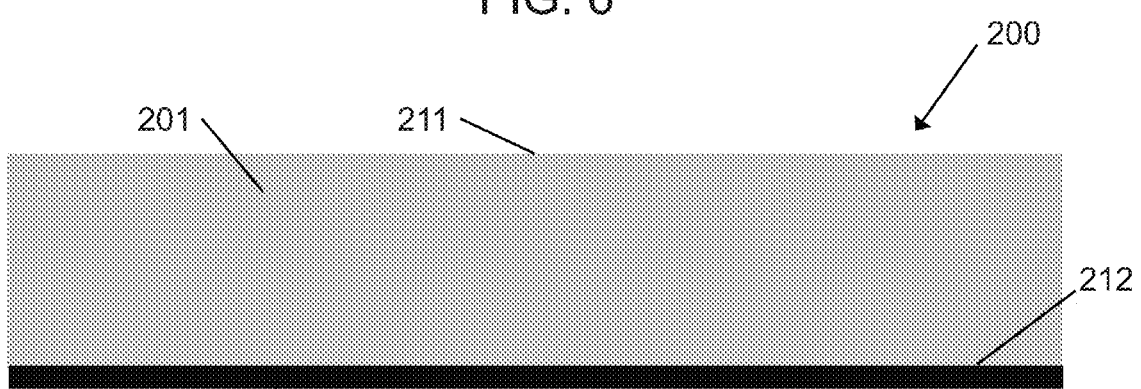
FIG. 7 shows a sacrificial layer with an opaque film of the present invention.

Referring to FIG. 7, in some embodiments, the opaque film (220) can either be on the top surface (211), the bottom surface (212) or both surfaces of the sacrificial layer (201). In some embodiments, the opaque film (220) can be applied by spraying, curing, thin film deposited or thick film opaque metallization. In some embodiments, the sacrificial layer (201) can be an opaque material, such as a silicon substrate. In some embodiments, the opaque film (220) is not necessarily required in certain applications.

In some embodiments, the sacrificial layer (201) with the opaque film (220) is fired in air or nitrogen atmospheres in a temperature range of 450° C. to 750° C. In some embodiments, the adhesive (230) is dried on the top surface (211) of the sacrificial layer (201) at a temperature of in the 50° C. to 320° C. at a duration of about 10 minutes to 4 hours. In some embodiments, the glass substrate and sacrificial glass substrate are adhered and cured at a temperature range of about 75° C. to 450° C. for a duration of about 10 minutes to 4 hour. In some embodiments, a ceramic substrate is placed on top of the bonded glass substrate and sacrificial layer for weight compression during the curing process.

Figure 8:
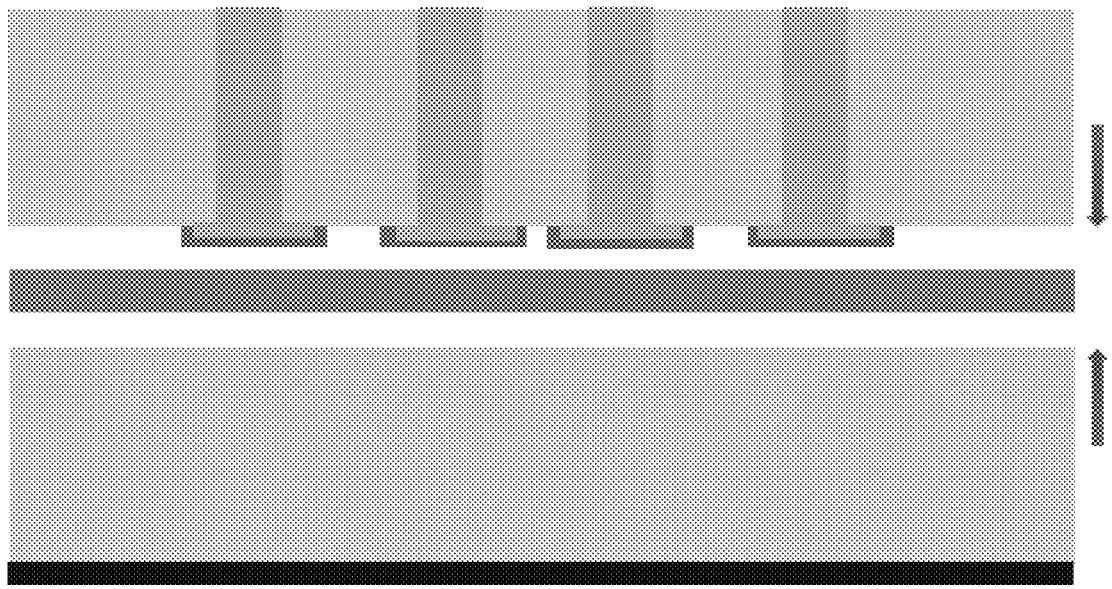
FIG. 8 shows an exploded view of the present invention with the metallized glass substrate, adhesive and sacrificial layer.
Figure 9:
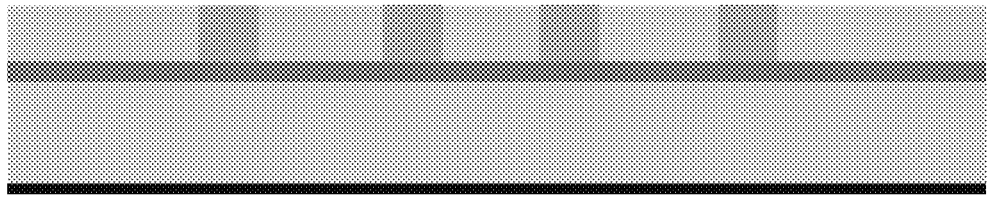
FIG. 9 shows an alternative embodiment of the present invention without the under-bump metallization pads.

Referring to FIG. 8, in some embodiments, the adhesive (230) can be applied by spraying, spinning, printing or laminating using a previously coated film. In some embodiments, the adhesive (230) is a liquid, paste or tape polymeric material that is typically used for this application. In some embodiments, the adhesive (230) is a photopolymer. In some embodiments, a glass transition temperature of the adhesive (230) is in a temperature range of 25° C. to 370° C., wherein the adhesive (230) that can withstand processing chemicals, temperatures and atmospheres. In some embodiments, the adhesive (230) bonds to the glass substrate (100) by thermal compression, heating, mechanical compression, vacuum bonding, or a combination thereof.

Figure 10:
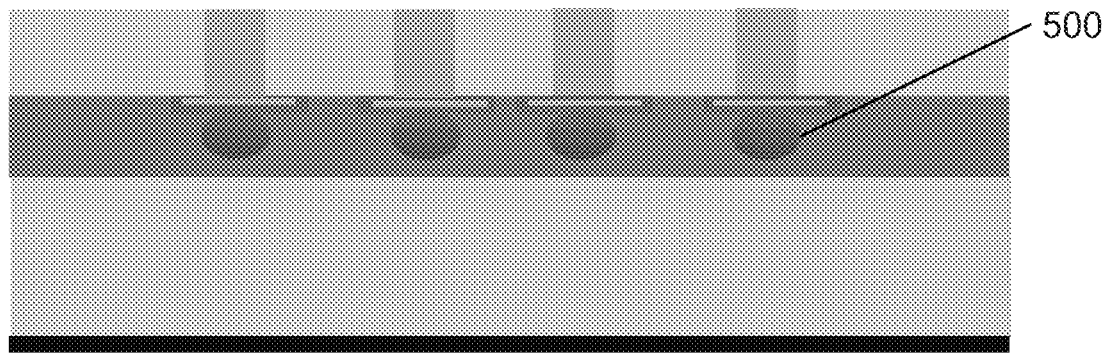
FIG. 10 shows an alternative embodiment of the present invention where solder bumps are attached to the under-bump metallization, followed by adhesion to the sacrificial substrate.

Referring to FIG. 10, in some embodiments, the bumps (500) can be solder bumps or other types of attachment bumps. In some embodiments, the UBM pads (400) can facilitate solder, braze, or other types of bumping that is standard in the industry. The bumps may be thick film metallizations (Cu, Ag, Au, Pd, Pt or mixtures and alloys thereof, by themselves, or followed by ENIG, ENIPIG or similar plating strategy based on the application. The bumps may also be thin film based, either by themselves or followed by ENIG, ENIPIG or similar plating strategy based on the application. The bumps are not-limited to the aforementioned examples.

Figure 11:
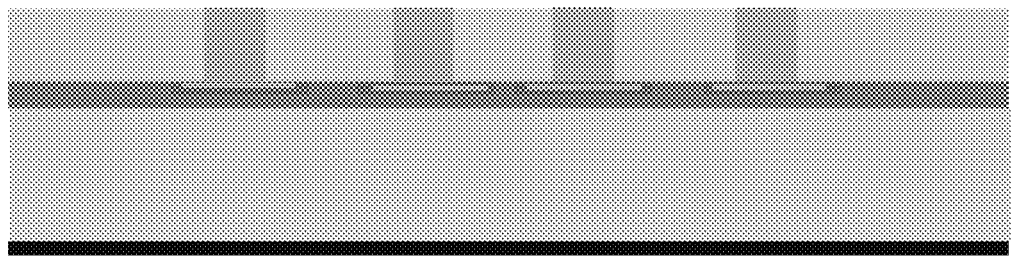
FIG. 11 shows an alternative embodiment of the present invention for the embodiment shown in FIG. 8, where a top surface is polished to make the metallized glass substrate thinner for further processing.

Referring to FIG. 11, in some embodiments, the top surface (111) is polished to make the glass substrate (100) thinner. In some embodiments, the polished top surface (111) is further metallized with a redistribution layer or a plurality of redistribution layers for attaching components and integrated circuits.

Figure 12:
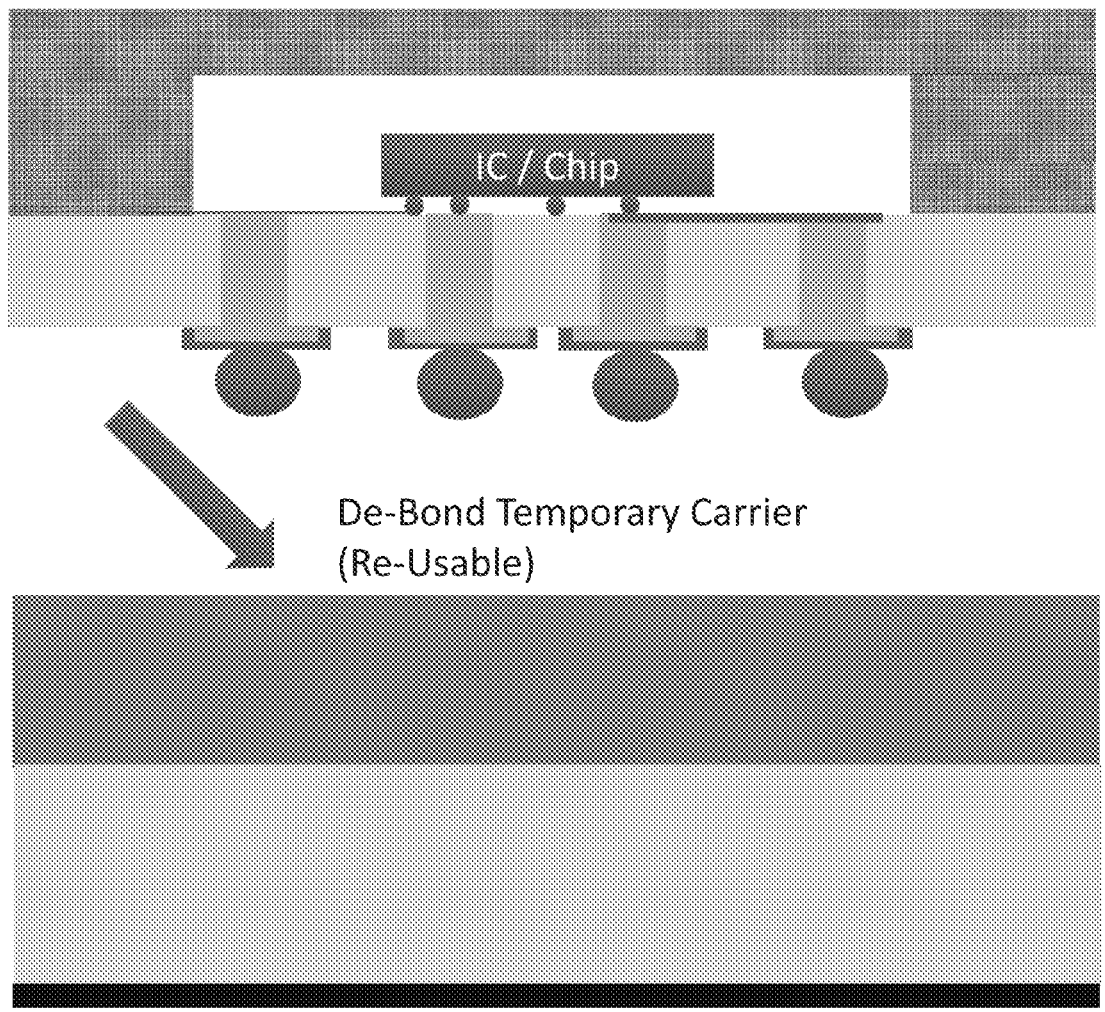
FIG. 12 shows an example of the present invention being used in one possible application.

Referring to FIG. 12, in some embodiments, after completing metallization of the top surface (111), the sacrificial substrate (200) is removed from the glass substrate (100) by thermal separation/sliding. In some embodiments, the sacrificial substrate (200) is removed from the glass substrate (100) by UV exposure of the photopolymer adhesive (230). In some embodiments, separation of the sacrificial substrate (200) from the glass substrate (100) is followed by rinsing the under-bump metallization pads (400) with an appropriate solvent to remove any traces of the adhesive (230). In some embodiments, the reinforcing approach described above allows for standard wafer processing equipment to accommodate processing and handling of glass based substrates.

The following are non-limiting examples of options for the backside metallizing and reinforcing system.

EXAMPLE 1

1. Provide a glass substrate with filled through-holes according to a customer's
2. Attach a sacrificial substrate to the glass substrate using an adhesive.
3. The customer's foundry can easily process the available surface, i.e. the top surface, of the glass substrate for a specific application, and ship to OSAT.
4. OSAT will de-bond the sacrificial substrate from the glass substrate and process the opposite surface of the glass substrate, i.e. the bottom surface.

EXAMPLE 2

1. Provide a glass substrate with filled through-holes, backside metallized pads, and UBM pads according to a customer's specifications.
2. Attach a sacrificial substrate to the glass substrate using an adhesive. The backside is ready for custom bumping.
3. The customer's foundry can easily process the available surface, i.e. the top surface, of the glass substrate for a specific application, and ship to OSAT.
4. OSAT will de-bond the sacrificial substrate from the glass substrate and process the opposite surface of the glass substrate.

EXAMPLE 3

1. Provide a glass substrate with filled through-holes, backside metallized pads, UBM pads, and solder bumps according to a customer's specifications.
2. Attach a sacrificial substrate to the glass substrate using an adhesive. The backside is ready for custom bumping. There is a complete foundry capability for the backside.
3. A customer's foundry can easily process the available surface, i.e. the top surface, of the glass substrate for a specific application and de-bond the sacrificial substrate from the glass substrate.

In some embodiments, a user may perform any of the following non-limiting and non-exhaustive applications with a glass substrate having the backside metallizing and reinforcing system: top side metallization and patterning with the sacrificial substrate attached; integrated circuit or wafer assembly with the sacrificial substrate attached; lid or cover assembly with the sacrificial substrate attached; testing with or without the sacrificial substrate attached; or dicing from wafer at the wafer level.

As used herein, the term "about" refers to plus or minus 10% of the referenced number.

The disclosures of the following U.S. Patents are incorporated in their entirety by reference herein: U.S. Pat. No. 8,584,354, U.S. 2013/0105211, WO2013138452, WO2012061302, U.S. Pat. No. 8,411,459, and U.S. 2013/0119555.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed:
1. A method of back metallizing and reinforcing a glass substrate, said method comprising:
   a. creating a plurality of through-holes in the glass substrate;
   b. filling the through-holes with a conductive type material;

c. applying a plurality of backside metallized pads to a bottom surface of the glass substrate;
d. enclosing the backside metallized pads with an under-bump metallization (UBM) pad and
e. attaching a sacrificial substrate to the glass substrate, said sacrificial substrate comprising:
   i. a sacrificial layer comprising a top surface and a bottom surface, wherein an opaque film coats the top surface, the bottom surface, or both the top surface and the bottom surface of the sacrificial layer; and
   ii. an adhesive applied to the top surface of the sacrificial layer;
wherein the adhesive binds the sacrificial layer to the bottom surface the glass substrate, whereby the sacrificial substrate protects the backside metallized pads and UBM pads, whereby the sacrificial substrate reinforces the glass substrate to provide support during handling and processing of the glass substrate.

2. The method of claim 1, wherein a plurality of bumps is attached to the UBM pads prior to attaching the sacrificial substrate.

3. The method of claim 1, wherein a plurality of redistribution layers is applied to the bottom surface of the glass substrate prior to applying the backside metallized pads.

4. The method of claim 1, wherein applying the backside metallized pads comprises:
   a. screen printing the backside metallized pads onto the glass substrate;
   b. drying the backside metallized pads; and
   c. sintering the backside metallized pads.

5. The method of claim 1 further comprising applying at least one layer of plating on the UBM pads prior to attaching the sacrificial substrate.

6. The method of claim 5, wherein a first layer of plating comprises Ti, Ni, or Al.

7. The method of claim 6, wherein a second layer of plating comprises Cu or Au.

8. The method of claim 7, wherein a third layer of plating comprises electroless and immersion metals.

9. The method of claim 8, wherein the electroless and immersion metals is electroless nickel immersion gold (ENIG) or electroless nickel/immersion palladium/immersion gold (ENIPIG).

10. The method of claim 1, wherein the opaque film is screen printed, laminated, sprayed, or thin-film deposited onto the sacrificial layer.

11. The method of claim 1, wherein the opaque film is dried and sintered.

12. The method of claim 1, wherein the top surface of the glass substrate is metallized, polished, or wire-bonded.

13. The method of claim 1, wherein the backside metallized pads cover the bottom end of the through-holes.

14. The method of claim 1, wherein the backside metallized pads are patterned.

15. The method of claim 1, wherein the backside metallized pads completely cover the bottom surface of the glass substrate.

16. The method of claim 1, wherein the backside metallized pads partially cover the bottom surface of the glass substrate.

17. The method of claim 1, wherein the conductive type material comprises:
   a. at least one metal;
   b. at least one glass frit composition;
   c. at least one solvent;
   d. at least one resin; and
   e. at least one non-conductive inert additive.

18. A method of back metallizing and reinforcing a glass substrate, said method comprising:
   a. creating a plurality of through-holes in the glass substrate;
   b. filling the through-holes with a conductive type material;
   c. applying a plurality of backside metallized pads to a bottom surface of the glass substrate;
   d. enclosing the backside metallized pads with an under-bump metallization (UBM) pad; and
   e. attaching a plurality of bumps to the UBM pads;
   f. attaching a sacrificial substrate to the glass substrate, said sacrificial substrate comprising:
      i. a sacrificial layer comprising a top surface and a bottom surface, wherein an opaque film oats the top surface, the bottom surface, or both the top surface and the bottom surface of the sacrificial layer; and
      ii. an adhesive applied to the top surface of the sacrificial layer;
   wherein the adhesive binds the sacrificial layer to the bottom surface of the glass substrate, whereby the sacrificial substrate protects the backside metallized pads and UBM pads, whereby the sacrificial substrate reinforces the glass substrate to provide support during handling and processing of the glass substrate.

19. The method of claim 18, wherein the conductive type material comprises:
   a. a metal;
   b. a glass frit composition;
   c. a solvent;
   d. a resin; and
   e. a non-conductive inert additive.

20. The method of claim 18 further comprising applying at least one layer of plating on the UBM pads prior to attaching the plurality of bumps to the UBM pads.

* * * * *